(12) United States Patent
Shih et al.

(10) Patent No.: US 6,188,132 B1
(45) Date of Patent: Feb. 13, 2001

(54) TWO-WAVELENGTH SEMICONDUCTOR LASER DIODE PACKAGE FOR USE ON THE READ/WRITE HEAD OF AN OPTICAL DRIVE CAPABLE OF READING DIFFERENT TYPES OF OPTICAL DISCS

(75) Inventors: Hsi-Fu Shih, Changhua Hsien; Tzu-Ping Yang, Taipei; Jinn-Kang Wang, Taipei Hsien, all of (TW); Mark O. Freeman, San Mateo, CA (US)

(73) Assignee: Industrial Technology Research Institute (TW)

(*) Notice: Under 35 U.S.C. 154(b), the term of this patent shall be extended for 0 days.

(21) Appl. No.: 09/063,738

(22) Filed: Apr. 21, 1998

(30) Foreign Application Priority Data

Sep. 15, 1997 (TW) ................................................ 86113360

(51) Int. Cl.$^7$ ................................................ H01L 23/34
(52) U.S. Cl. .............................. 257/724; 257/82; 257/98; 257/99; 257/706; 257/723
(58) Field of Search .................................. 369/44.12, 54, 369/116, 120, 121, 103, 110, 112; 438/26, 27, 106, 121, 122, 28, 34, 35; 257/98, 99, 100, 675, 680, 787, 706, 81, 82, 723, 724, 707

(56) References Cited

U.S. PATENT DOCUMENTS

| | | | |
|---|---|---|---|
| 4,797,866 | * | 1/1989 | Yoshikawa ............................ 369/43 |
| 4,853,923 | * | 8/1989 | Yamada et al. ...................... 369/120 |
| 4,868,820 | * | 9/1989 | Nagashima et al. ................... 369/44 |
| 5,448,587 | * | 9/1995 | Huang ................................ 372/107 |
| 5,504,350 | * | 4/1996 | Ortyn .................................... 257/81 |
| 5,544,143 | * | 8/1996 | Kay et al. ........................... 369/109 |
| 5,615,181 | * | 3/1997 | Hosokawa et al. ................... 369/13 |
| 5,680,385 | * | 10/1997 | Nagano .............................. 369/112 |
| 5,696,750 | * | 12/1997 | Katayama .......................... 369/112 |
| 5,745,304 | * | 4/1998 | Choi .................................. 359/719 |
| 5,768,221 | * | 6/1998 | Kasami et al. ....................... 369/14 |
| 5,825,794 | * | 10/1998 | Ogino et al. ......................... 372/36 |
| 5,894,464 | * | 4/1999 | Kim et al. .......................... 369/103 |
| 5,940,360 | * | 8/1999 | Choi .................................. 369/112 |
| 5,989,722 | * | 4/1999 | Ramdani et al. ..................... 372/50 |
| 6,016,300 | * | 1/2000 | Takeda et al. ...................... 369/103 |
| 6,043,911 | * | 3/2000 | Yang .................................. 359/15 |

* cited by examiner

Primary Examiner—Olik Chaudhuri
Assistant Examiner—Alonzo Chambliss
(74) Attorney, Agent, or Firm—Blakely Sokoloff Taylor & Zafman

(57) ABSTRACT

A two-wavelength laser diode package is provided, which can be utilized in the read/write head of an optical drive capable of reading data from different types of optical discs, such as CD (compact disc), CD-R (CD Recordable) and DVD (digital versatile disc). The laser diode package includes a pair of laser diodes of two different specifications in wavelength, which are disposed on one or two submounts, either horizontally or vertically oriented with each other. Further, a beam coinciding means, such as a micro dichroic prism, a micro dichroic plate, a micro dichroic beam-splitter, or an external dichroic beam-splitter, is used to make the two respective laser beams from the two laser diodes to propagate on the same propagation axis when in use.

6 Claims, 9 Drawing Sheets

TWO-WAVELENGTH SEMICONDUCTOR LASER DIODE PACKAGE FOR USE ON THE READ/WRITE HEAD OF AN OPTICAL DRIVE CAPABLE OF READING DIFFERENT TYPES OF OPTICAL DISCS

CROSS-REFERENCE TO RELATED APPLICATION

This application claims the priority benefit of Taiwan application serial no. 86113360, filed Sep., 15, 1997, the full disclosure of which is incorporated herein by reference.

BACKGROUND OF THE INVENTION

1. Field of the Invention

This invention relates to laser sources used in optical drives, and more particularly, to a two-wavelength laser diode package that can be utilized in the read/write head of an optical drive, allowing the optical drive to be capable of reading data from two different types of optical discs, such as CD (compact disc), CD-R (CD Recordable), and DVD (digital versatile disc).

2. Description of Related Art

A laser diode is a semiconductor laser source which is capable of generating a laser beam of a specific wavelength. The laser diode is useful in many various applications; for example, it can be used in an optical drive for reading data from an optical disc, such as a CD, a CD-R or a DVD. Laser diodes are usually supplied in packages. Conventional laser diode packages, such as the widely used TO type package, are structured to pack only a single laser diode therein that allows the laser diode package to be useful for generating a single-wavelength laser beam. In some applications, however, two different wavelengths of laser beams may be required, such as an optical drive capable of reading data from two different types of optical discs.

FIG. 1A is a schematic perspective diagram showing a conventional laser diode package which packs one single-wavelength laser diode therein; and FIG. 1B shows a variation to the inside structure of the laser diode package of FIG. 1A.

As shown in FIG. 1A, the laser diode package includes an enclosure 18 which is used to pack a laser-diode chip 10, a submount 12, a heat sink 14, and a power monitor 16 therein. Inside the enclosure 18, the laser-diode chip 10 is mounted on the submount 12, and the submount 12 is mounted on the heat sink 14 which is used to dissipate the heat generated from the laser-diode chip 10. Further, the enclosure 18 is formed with a window 20 on the top thereof which allows the laser beam generated by the laser-diode chip 10 to pass therethrough to the outside of the laser diode package.

FIG. 1B shows a variation to the inside structure of the laser diode package of FIG. 1A, in which the power monitor (here designated instead by the reference numeral 16a) is mounted along with the laser diode (here designated instead by the reference numeral 10a) on the submount (here designated instead by the reference numeral 12a). Fundamentally, the power monitor should be disposed on the back side of the laser-diode chip for the purpose of monitoring the output power of the laser beam generated by the laser-diode chip.

The foregoing laser diode package is only capable of providing a single-wavelength laser beam that can be used in an optical drive to read data from one type of optical disc, such as the conventional low-density CDs or CD-Rs. With the advent of new high-density optical storage media, such as the newly introduced DVDs, a laser beam of a shorter wavelength should be used to read data from this new type of optical disc. For compatibility reasons, however, new DVD drives should be also capable of reading data from the old type of optical discs (i.e., CDs or CD-Rs) so that their use is more versatile.

FIG. 2 is a schematic diagram showing the optical structure of the read head of an optical drive that is capable of reading data from either a CD, a CD-R or a DVD. As shown, this read head includes a pair of separate single-wavelength laser sources including a first laser source 22a (a laser module including a laser diode and a photo-detector) for generating a laser beam of a first wavelength, for example 780 nm (nanometer), and a second laser source 22b (a laser diode) for generating a laser beam of a second wave-length, for example from 635 nm to 650 nm. The first and second laser sources 22a, 22b can be selectively activated depending on the type of the optical disc (for example, a CD, CD-R or a DVD) currently being inserted in the drive. In the case of reading a CD or a CD-R, for example, the first laser source 22a is activated while the second laser source 22b is deactivated; whereas in the case of reading a DVD, the first laser source 22a is deactivated while the second laser source 22b is activated.

When the first laser source 22a is activated (in the case of reading a CD or a CD-R, for example), it generates a laser beam which is then reflected by the reflective mirror 24a to an object lens 26a where the laser beam is focused onto the CD or CD-R where the data to be read out are located.

When the second laser source 22b is activated (in the case of reading a DVD, for example), it generates a laser beam which is then reflected by a beam splitter 24b to another propagation path 20b and subsequently passes through a collimator 28b where the laser beam is collimated into a straight beam. Subsequently, the laser beam passing through the collimator 28b is reflected by a reflecting mirror 30b to an object lens 32b where the laser beam is focused onto the DVD where the data to be read out are located. The reflected light from the DVD then propagates reversely back to the beam splitter 24b which admits part of the reflected light to transmit therethrough to a propagation path 20c on which a photo detector 26b is mounted.

One drawback to the foregoing read/write head has the complexity in structure. A CD-R can only access data by using a laser light of 780 nm. To achieve the reverse compatibility of CD-R, the high manufacturing cost is high since two separate single-wavelength laser sources, for example, one laser diode of 635 nm to 650 nm and the other laser of 780 nm, are required to allow the optical drive to be able to read data from either a CD, a CD-R or a DVD. With the advent of the high-density DVDs, newly developed optical drives are specifically designed to read data from this new type of optical disc. For compatibility reasons, however, new DVD drives should be also capable of reading data from the old CDs or CD-Rs so that the customers can have more versatility in using their new optical drives. There exists, therefore, a need for a laser diode package that can be used to selectively generate one of two laser beams of different specifications in wavelength.

SUMMARY OF THE INVENTION

It is therefore an objective of the present invention to provide a laser diode package which packs two laser diodes therein, allowing the laser diode package to be used in optical drives capable of reading data from different types of optical discs, such as CD, CD-R and DVD.

In accordance with the foregoing and other objectives of the present invention, a new laser diode package is provided. The laser diode package of the invention includes a pair of laser diodes of two different specifications in wavelength, which are disposed on one or two submounts, either horizontally or vertically oriented with each other. To allow the respective two laser beams from the two laser diodes to propagate on the same optical axis, a beam coinciding means is provided. This beam coinciding means can be either a micro dichroic prism, a micro dichroic plate, a micro dichroic beam-splitter, or an external dichroic beam-splitter, which is used to make the two respective laser beams from the two laser diodes to come into coincidence on the same propagation axis.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1B:
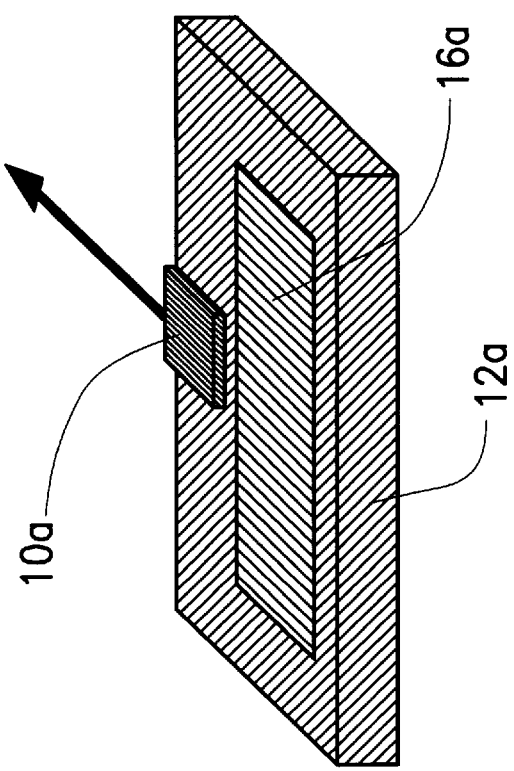
FIG. 1B shows a variation to the inside structure of the laser diode package of FIG. 1A.
Figure 1A:
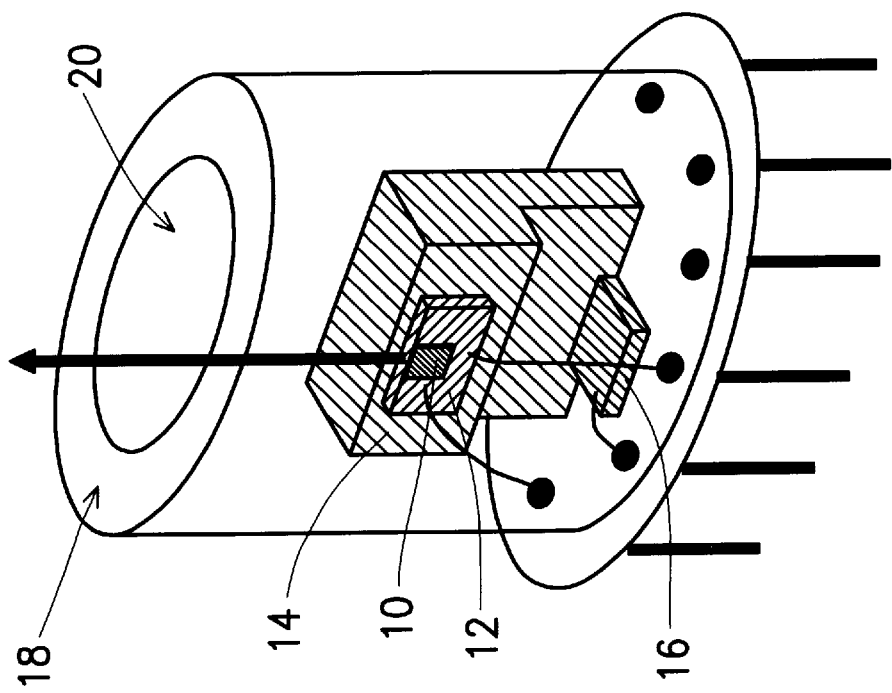
FIG. 1A is a schematic perspective diagram showing a conventional laser diode package which packs one single-wavelength laser diode therein.
Figure 2:
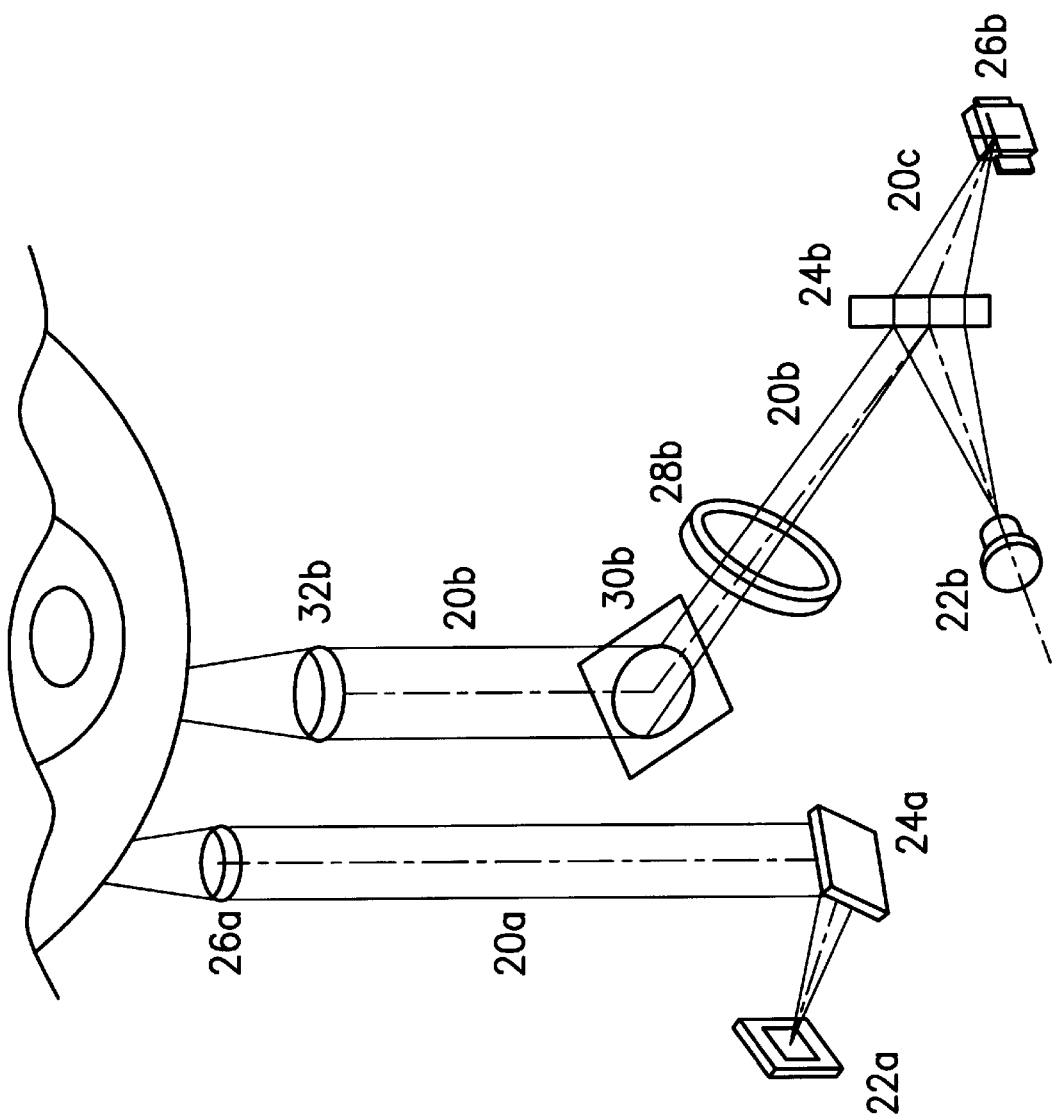
FIG. 2 is a schematic diagram showing the optical structure of a conventional read/write head for an optical drive, in which the conventional laser diode package is used.
Figure 3B:
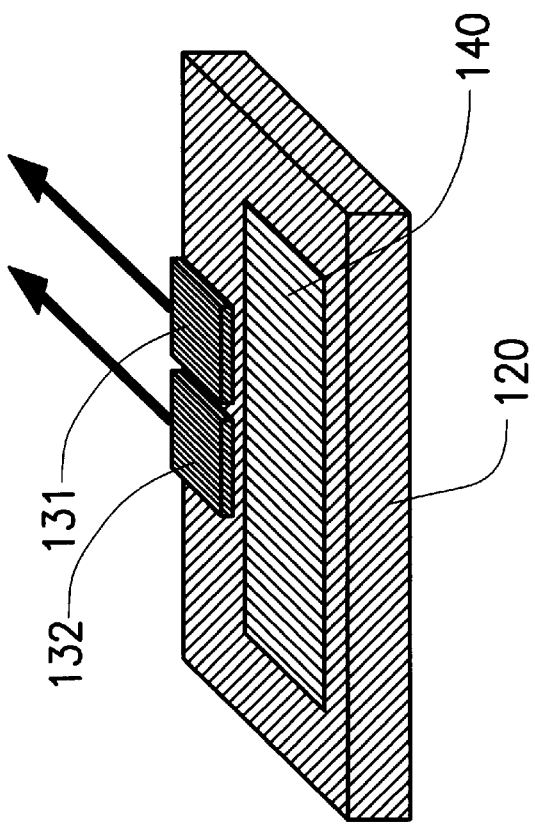
FIG. 3B shows a variation to the inside structure of the laser diode package of FIG. 3A.

A first preferred embodiment of the laser diode package according to the invention is disclosed and described in detail in the following with reference to FIGS. 3A–3B.

Figure 3A:
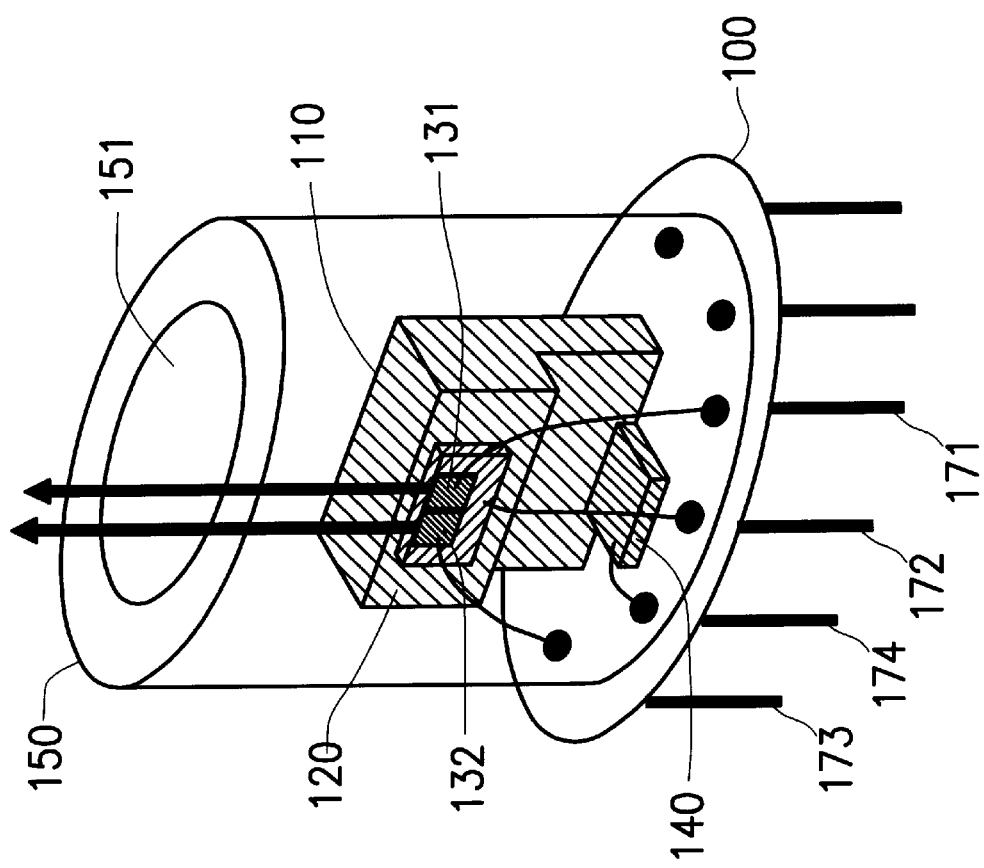
FIG. 3A is a schematic perspective diagram showing a first preferred embodiment of the laser diode package according to the invention.

As shown in FIG. 3A, the laser diode package of this embodiment includes a base 100, a heat sink 110 mounted on the base 100, a submount 120 mounted on the heat sink 110, and a pair of laser diodes including a first laser diode 131 and a second laser diode 132 which are disposed side by side to each other on the submount 120 and oriented in such a manner that the two optical axes of the respective laser beams emitting therefrom are in parallel and close proximity to each other, as indicated by the bold arrows in FIG. 3A. Further, the laser diode package includes a power-monitor photo-detector 140 disposed on the back of the first and second laser diodes 131, 132 and mounted on the base 100. The power-monitor photo-detector 140 is used to monitor the output power of the first and second laser diodes 131, 132. All of the foregoing elements are packed in an enclosure 150. Further, the enclosure 150 is formed with a window 151 on the top thereof, which allows the respective laser beams emitted from the first and second laser diodes 131, 132 to pass therethrough to the outside of the laser diode package.

The first laser diode 131 has one electrode electrically wired to a first external pin 171 and the other electrode connected to a common pad (not shown) on the submount 120 which is then electrically wired to a second external pin 172. In a similar manner, the second laser diode 132 has one electrode electrically wired to a third external pin 173 and the other electrode connected to the common pad (not shown) on the submount 120 which is electrically wired to the second external pin 172.

In FIG. 3A, the power-monitor photo-detector 140 is mounted on the base 100 and electrically wired to a fourth external pin 174. Alternatively, FIG. 3B shows a variation to the inside structure of the laser diode package, in which the power-monitor photo-detector, here designated by the reference numeral 141, is disposed along with the first and second laser diodes 131, 132 on the submount 120.

In a practical application, for example, one of the first and second laser diodes 131, 132 is used to generate a laser beam of 780 nm in wavelength and the other is used to generate a laser beam of 635 nm to 650 nm in wavelength.

With the foregoing laser diode package, the two laser beams from the two first and second laser diodes 131, 132 propagate on two respective parallel and closely spaced optical axes. In use, an external beam coinciding means can be provided to allow the respective two laser beams from the first and second laser diodes 131, 132 to propagate substantially on the same optical axis. Details of this will be described later in this specification with reference to FIG. 8.

Second Preferred Embodiment

Figure 4B:
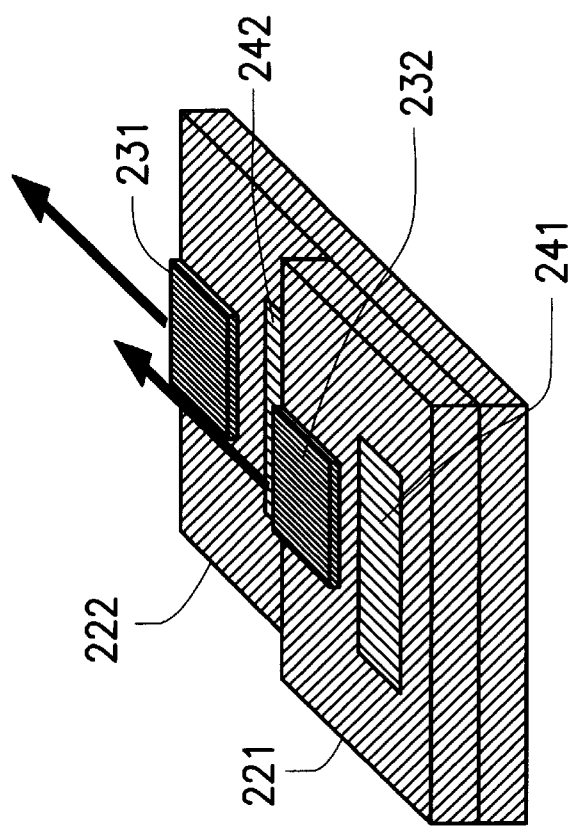
FIG. 4B shows a variation to the inside structure of the laser diode package of FIG. 4A

A second preferred embodiment of the laser diode package according to the invention is disclosed and described in detail in the following with reference to FIGS. 4A–4B.

Figure 4A:
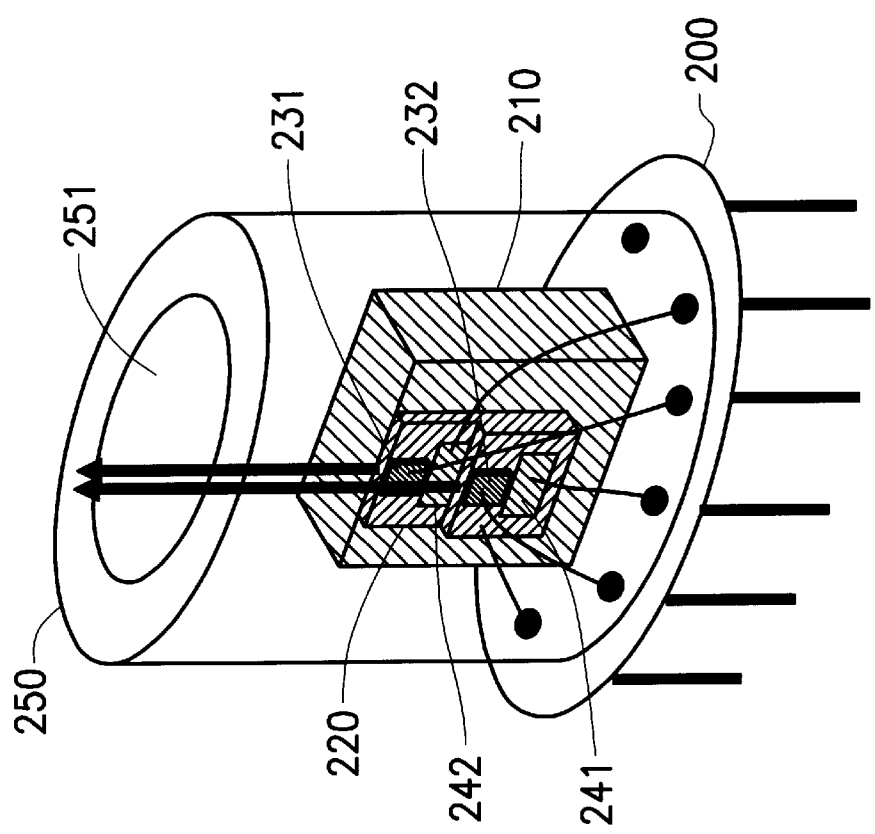
FIG. 4A is a schematic perspective diagram showing a second preferred embodiment of the laser diode package according to the invention.

As shown in FIG. 4A, the laser diode package of this embodiment includes a base 200, a heat sink 210 mounted on the base 200, an integrally formed submount 220 having a two-step stair-like structure including a low surface and a high surface mounted on the heat sink 210, and a pair of laser diodes including a first laser diode 231 mounted on the high surface of the first submount 221 and a second laser diode 232 mounted on the low surface of the submount 220. The high surface of the submount 220 has a height above the low surface of the same that allows the optical axes of the respective laser beams emitting from the first and second laser diodes 231, 232 to be in parallel and close proximity to each other.

The submount 220 in FIG. 4A is an integrally formed piece. However, as shown in FIG. 4B, it can also be a stack of two separate pieces including a first submount 221 and a second submount 222 stacked on the first submount 221, with the first laser diode 231 being mounted on the first submount 221 and the second laser diode 232 being mounted on the second submount 222.

Further, the laser diode package includes a first power-monitor photo-detector 241 disposed on the back side of the first laser diode 231 for monitoring the output power of the laser beam generated by the first laser diode 231, and a second power-monitor photo-detector 242 disposed on the back side of the second laser diode 232 for monitoring the output power of the laser beam generated by the second laser diode 232.

All of the foregoing elements are packed in an enclosure 250 having a window 251 on the top which allows the laser beam emitted from either the first laser diode 231 or the second laser diode 232 to pass therethrough to the outside of the laser diode package.

In a practical application, for example, one of the first and second laser diodes 231, 232 is used to generate a laser beam of 780 nm in wavelength and the other is used to generate a laser beam of 635 nm to 650 nm in wavelength.

With the foregoing laser diode package, the two laser beams from the two first and second laser diodes 231, 232 propagate on two respective parallel and closely spaced optical axes. In use, an external beam coinciding means can be provided to allow the respective two laser beams from the first and second laser diodes 231, 232 to propagate substantially on the same optical axis. Details of this will be described later in this specification with reference to FIG. 8.

Third Preferred Embodiment

In the previous embodiments, the two respective laser beams are emitting out of the laser diode package on two separate but closely and parallel aligned optical axes. In the following, three further preferred embodiments are disclosed, which allow the two respective laser beams from the first and second laser diodes to be emitted out of the laser diode package substantially on the same optical axis.

A third preferred embodiment of the laser diode package according to the invention is disclosed and described in detail in the following with reference to FIG. 5.

Figure 5:
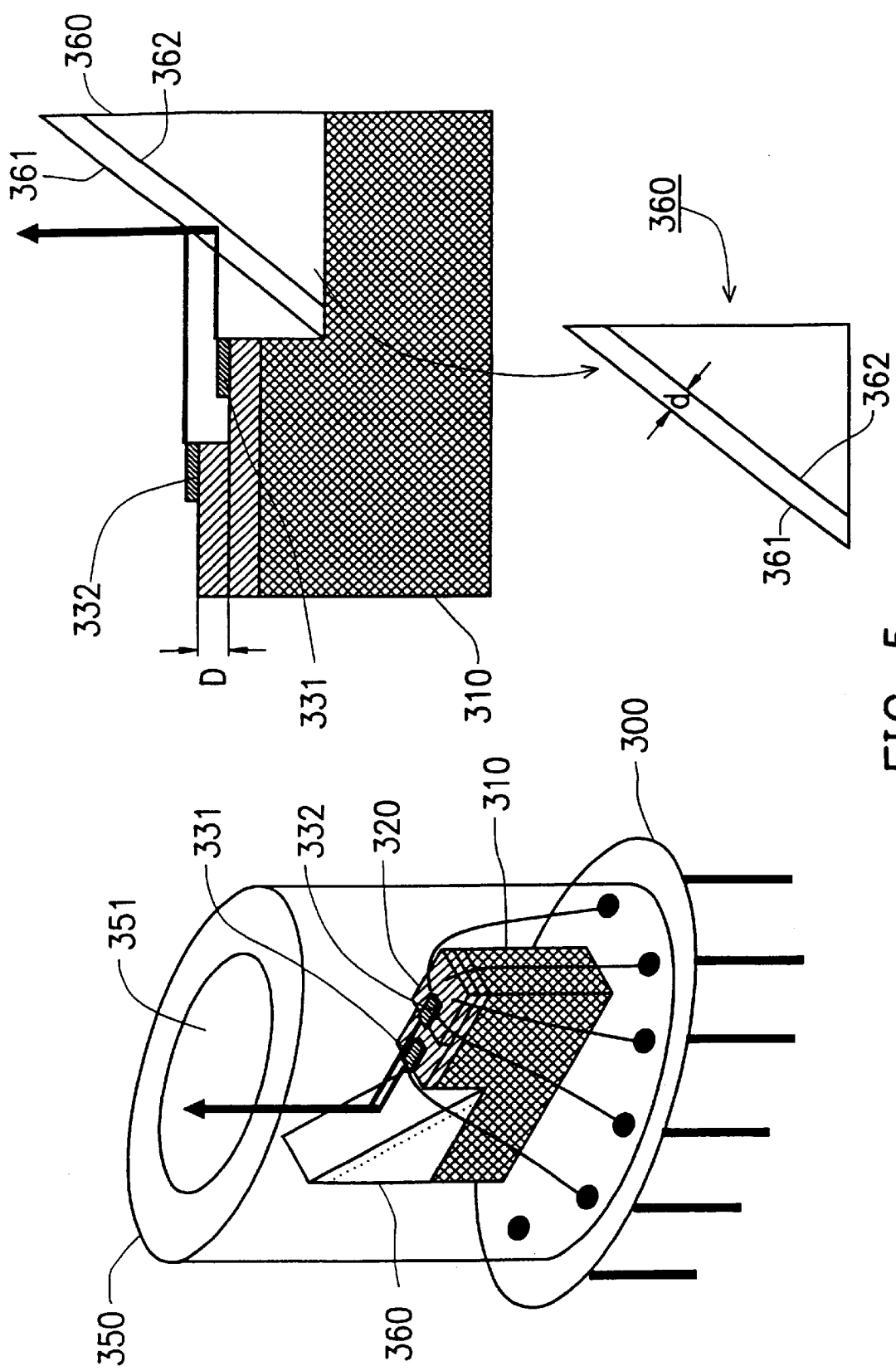
FIG. 5 is a schematic perspective diagram showing a third preferred embodiment of the laser diode package according to the invention.

As shown in FIG. 5, the laser diode package of this embodiment includes a base 300, a heat sink 310 having a high surface and a low surface and mounted on the base 300, a stacked stair-like structure including a first submount 321 mounted on the heat sink 310 and a second submount 322 mounted on the first submount 321, and a pair of laser diodes including a first laser diode 331 mounted on the first submount 321 and a second laser diode 332 mounted on the second submount 322. The second submount 322 has a height D above the first submount 321.

Further, the laser diode package includes a first power-monitor photo-detector 341 disposed on the back side of the first laser diode 331 for monitoring the output power of the laser beam generated by the first laser diode 331, and a second power-monitor photo-detector 342 disposed on the back side of the second laser diode 332 for monitoring the output power of the laser beam generated by the second laser diode 332.

All of the foregoing elements are packed in an enclosure 350 having a window 351 on the top which allows the laser beam emitted from either the first laser diode 331 or the second laser diode 332 to pass therethrough to the outside of the enclosure 350.

This embodiment differs from the previous two embodiments particularly in that the laser diode package here includes a micro dichroic prism 360, which allows the respective emitting laser beams from the first and second laser diodes 331, 332 to be emitted to the outside of the enclosure 350 substantially on the same optical axis. The micro dichroic prism 360 includes a top reflective surface 361 and a bottom reflective surface 362 which are separated by a thickness d, where $d=D/\sqrt{2}$ for this particular embodiment. The micro dichroic prism 360 is mounted on a cutaway portion of the heat sink 310 and oriented in such a manner that the respective laser beams emitted from the first and second laser diodes 331, 332 will strike on the top reflective surface 361 with an incident angle of 45°. The top reflective surface 361 has a reflectivity of nearly 100% for the laser beam from the first laser diode 331 and a transmittance of nearly 100% for the laser beam from the second laser diode 332. The laser beam from the first laser diode 331 is therefore reflected by the exposed surface of the coating 351 by an angle of 45° to the desired common optical axis. For the laser beam from the second laser diode 332, after transmitting through the top reflective surface 361, it will be subsequently reflected by the bottom reflective surface 362 also by an angle of 45°, subsequently pass through the top reflective surface 361 to the same common optical axis. Therefore, the two respective laser beams from the first and second laser diodes 331, 332 will be emitted out of the laser diode package substantially on the same common optical axis.

Fourth Preferred Embodiment

A fourth preferred embodiment of the laser diode package according to the invention is disclosed and described in detail in the following with reference to FIG. 6.

Figure 6:
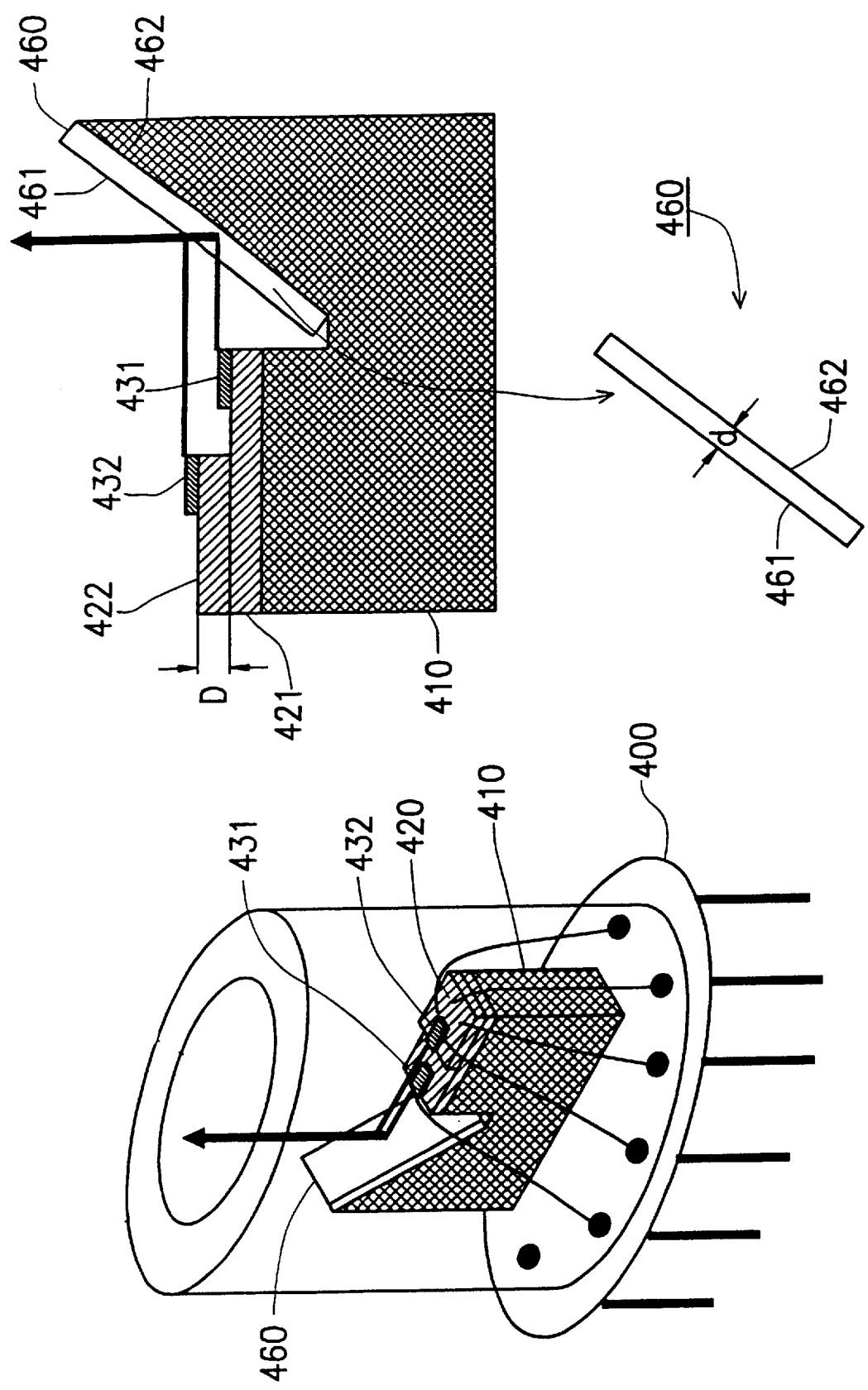
FIG. 6 is a schematic perspective diagram showing a fourth preferred embodiment of the laser diode package according to the invention.

As shown in FIG. 6, the laser diode package of this embodiment includes a base 400, a heat sink 410 mounted on the base 400, a stacked stair-like 420 structure including a first submount 421 mounted on the heat sink 410 and a second submount 422 mounted on the first submount 421, and a pair of laser diodes including a first laser diode 431 mounted on the first submount 421 and a second laser diode 432 mounted on the second submount 422. The second submount 422 has a height D above the first subFILE: mount 421. These elements are the same as those in the previous embodiment of FIG. 5, so description thereof will not be further detailed.

This embodiment differs from the previous third embodiment only in that the micro dichroic prism 360 in the previous embodiment is here replaced by a micro dichroic plate 460 which is mounted on the inclined surface of a protruded triangular portion of the heat sink 410. Similarly, the micro dichroic plate 460 has a top reflective surface 461 and a bottom reflective surface 462. The orientation and function of the top and bottom reflective surfaces 461, 462 here are the same as the top and bottom reflective surfaces 361, 362 in the previous embodiment of FIG. 5, so description thereof will not be further detailed.

Fifth Preferred Embodiment

A fifth preferred embodiment of the laser diode package according to the invention is disclosed and described in detail in the following with reference to FIG. 7.

Figure 7:
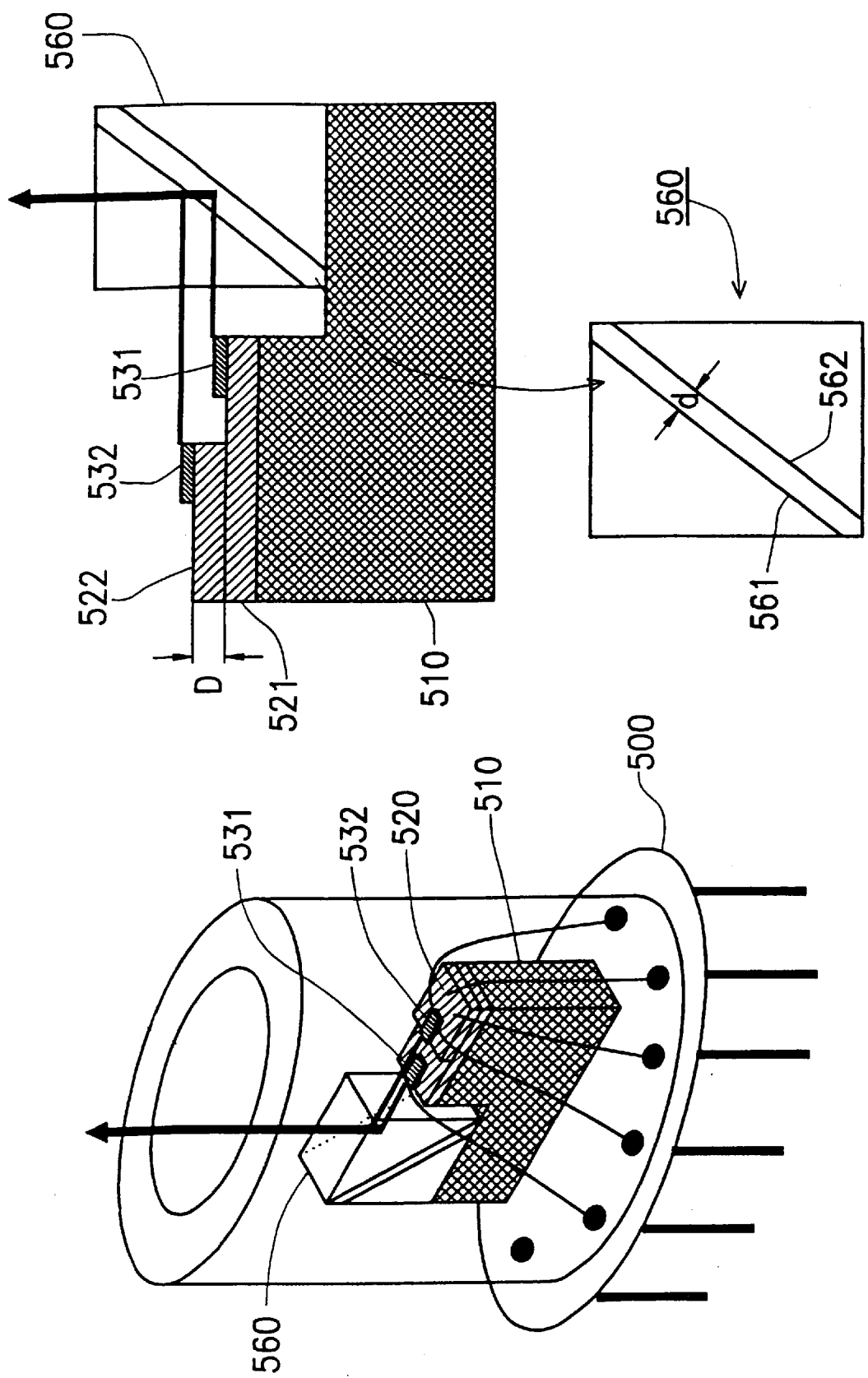
FIG. 7 is a schematic perspective diagram showing a fifth preferred embodiment of the laser diode package according to the invention.

As shown in FIG. 7, the laser diode package of this embodiment includes a base 500, a heat sink 510 mounted on the base 500, a stacked stair-like 520 structure including a first submount 521 mounted on the heat sink 510 and a second submount 522 mounted on the first submount 521, and a pair of laser diodes including a first laser diode 531 mounted on the first submount 521 and a second laser diode 532 mounted on the second submount 522. The second submount 522 has a height D above the first submount 521. These elements are the same as those in the previous embodiments of FIGS. 5 and 6, so description thereof will not be further detailed.

This embodiment differs from the previous embodiments of FIGS. 5 and 6 only in that the micro dichroic prism 360 or the micro dichroic plate 460 in the previous embodiments is here replaced by a micro dichroic beam-splitter 560 which is a cubic body mounted on a cutaway portion of the heat sink 510. The micro dichroic beam-splitter 560 has a first reflective surface 561 and a second reflective surface 562. The orientation and function of these two reflective surfaces 561, 562 here are the same as the reflective surfaces 361, 362 in FIG. 5 and the reflective surfaces 461, 462, so description thereof will not be further detailed.

Figure 8:
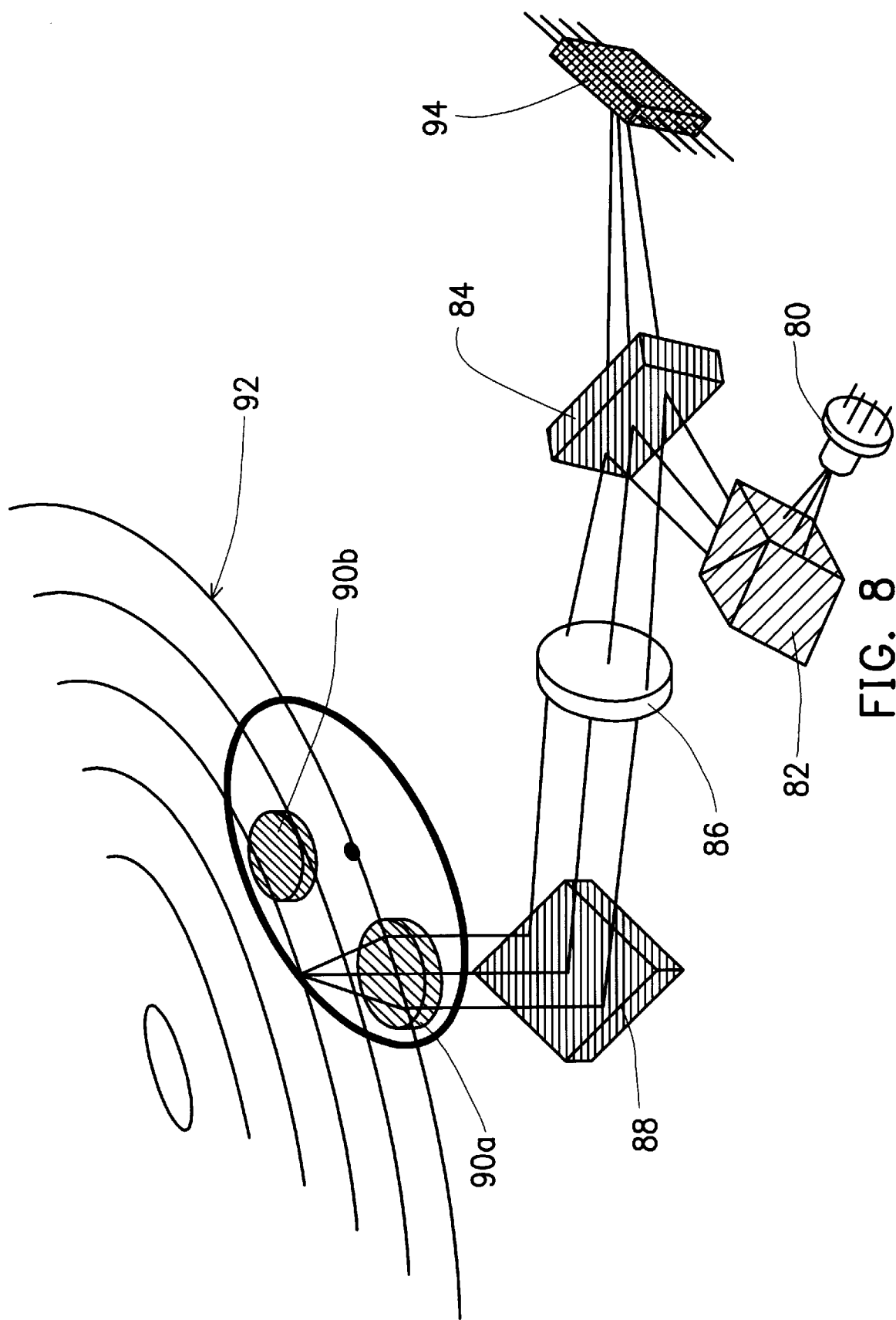
FIG. 8 is a schematic diagram showing the utilization of the laser diode package of the first or second preferred embodiment in the read/write head of an optical drive.

FIG. 8 is a schematic diagram showing the utilization of the laser diode package of the first or the second preferred embodiment in the read/write head of an optical drive. The laser diode package used here is designated by the reference numeral 80. As mentioned earlier, the laser diode package of the first or second preferred embodiment is designed in such a manner that the optical axes of the respective laser beams generated from the two laser diode therein are not exactly coincident with each other; therefore, the read/write head of the optical drive should be provided with an external beam coinciding means, such as a two-wavelength dichroic beam-splitter 82 shown here, to make the two respective laser beams from the laser diode package to propagate on the same optical axis to the system.

In addition to the laser diode package 80 and the dichroic beam-splitter 82, the read/write head further includes a beam splitter 84, a collimator 86, a reflecting mirror 88, a first object lens 90*a* (which is used when reading a DVD), and a second object lens 90*b* (which is used when reading a CD or a CD-R). This read/write head is used to read data from an optical disc 92 which can be either a DVD, a CD or a CD-R. The reflected light from the optical disc 92 then propagates reverse to an photo-detector 94. The read operation carried out by this system is same as conventional systems, so description thereof will not be further detailed.

Figure 9:
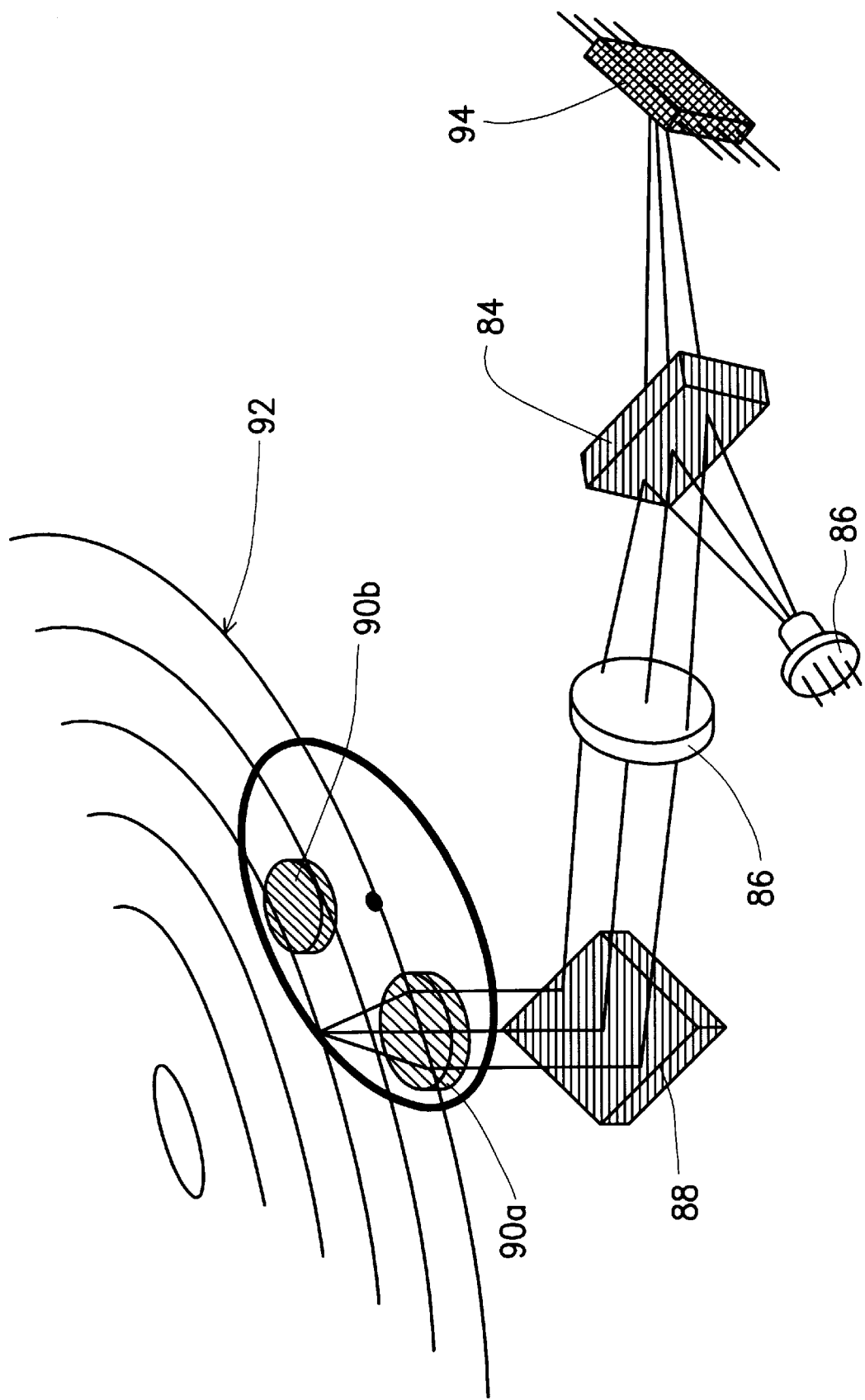
FIG. 9 is a schematic diagram showing the utilization of the laser diode package of the third, fourth, or fifth preferred embodiment in the read/write head of an optical drive.

FIG. 9 is a schematic diagram showing the utilization of the laser diode package of the third, fourth, or fifth preferred embodiment in the read/write head of an optical drive. The laser diode package used here is designated by the reference numeral 8 1. Specially speaking, the laser diode package of the third, fourth, or fifth preferred embodiment is designed in such a manner that the optical axes of the respective emitting laser beams from the two laser diode therein are exactly coincident with each other; therefore, the dichroic beam-splitter 82 used in the system of FIG. 8 can be here eliminated. Beside this, all the other constituent components are the same as those in the system of FIG. 8 and labeled with the same reference numerals; therefore, description thereof will not be further detailed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A laser diode.package, which comprises:
a base;
a heat sink mounted on or built up from said base;
a submount mounted on said heat sink;
a first laser diode mounted on said submount, wherin said first laser diode generates a first-wavelength laser beam which is directed to propagate on a first optical axis; and
a second laser diode mounted substantially in close proximity to said first laser diode on said submount, wherin said second laser diode generates a second-wavelength laser beam which is directed to propagate on a second optical axis substantially in parallel and close proximity to said first optical axis on which the first-wavelength laser beam propagates.

2. The laser diode package of claim 1, further comprising:
a power-monitor photo detector, disposed on said base on the back side of said first and second laser diodes, for monitoring the output power of the respective laser beams generated by said first and second laser diodes.

3. The laser diode package of claim 1, further comprising:
a power-monitor photo detector, disposed on said submount on the back side of said first and second laser diodes, for monitoring the output power of the respective laser beams generated by said first and second laser diodes.

4. The laser diode package of claim 1, wherein
the first-wavelength laser beam generated by said first laser diode has a wavelength of 780 nm, and
the second-wavelength laser beam generated by said second laser diode has a wavelength of from 635 nm to 650 nm.

5. The laser diode package of claim 1, wherein
the first-wavelength laser beam generated by said first laser diode has a wavelenght of from 635 to 650 nm, and
the second-wavelength laser beam generated by said second laser diode has a wavelength of 780 nm.

6. The laser diode package of claim 1, further comprising:
a micro dichroic prism, mounted on said heat sink, said micro dichroic prism having a first reflective surface and a second reflective surface oriented in parallel to said first reflective surface, said first reflective surface being oriented in such a manner as to allow the respective laser beams from said first and second laser diodes to strike thereon at an incident angle of 45°;
wherein said first reflective surface has high reflectivity with respect to the wavelength of the first-wavelength laser beam from said first laser diode and high transmissivity with respect to the wavelength of the second-wavelength laser beam from said second laser diode; and said second reflective surface has high reflectivity with respect to the wavelength of the second-wavelength laser beam from said second laser diode.

* * * * *